(12) United States Patent
Craik et al.

(10) Patent No.: US 10,002,010 B2
(45) Date of Patent: Jun. 19, 2018

(54) MULTI-BYTE COMPRESSED STRING REPRESENTATION

(71) Applicant: International Business Machines Corporation, Armonk, NY (US)

(72) Inventors: Andrew J. Craik, North York (CA); Filip Jeremic, Hamilton (CA); Vijay Sundaresan, North York (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 35 days.

(21) Appl. No.: 15/154,111

(22) Filed: May 13, 2016

(65) Prior Publication Data
US 2017/0329619 A1 Nov. 16, 2017

(51) Int. Cl.
G06F 8/30 (2018.01)
G06F 9/455 (2018.01)
H03M 7/30 (2006.01)
G06F 9/45 (2006.01)

(52) U.S. Cl.
CPC ............ *G06F 9/45504* (2013.01); *G06F 8/41* (2013.01); *H03M 7/6011* (2013.01); *H03M 7/702* (2013.01)

(58) Field of Classification Search
CPC ................ G06F 7/78; G06F 8/00–8/78; G06F 9/44–9/455; G06F 11/36
See application file for complete search history.

(56) References Cited

U.S. PATENT DOCUMENTS

| | | | |
|---|---|---|---|
| 6,275,921 B1 * | 8/2001 | Iwata | G06F 9/3853 712/210 |
| 7,162,712 B2 | 1/2007 | Shaylor et al. | |
| 8,839,215 B2 | 9/2014 | Hrischuk et al. | |

(Continued)

OTHER PUBLICATIONS

Wandelt et al., MRCSI: Compressing and Searching String Collections with Multiple References, 2015.*

(Continued)

*Primary Examiner* — S. Sough
*Assistant Examiner* — Zhan Chen
(74) *Attorney, Agent, or Firm* — Patterson + Sheridan, LLP

(57) ABSTRACT

Multi-byte compressed string representation embodiments define a String class control field identifying compression as enabled/disabled, and another control field, identifying a decompressed string created when compression enabled. Tests are noped based on null setting of the compression flag. When arguments to a String class constructor are not compressible, a decompressed String is created and string-CompressionFlag initialized. Endian-aware helper methods for reading/writing byte and character values are defined. Enhanced String class constructors, when characters are not compressible, create a decompressed String, and initialize stringCompressionFlag triggering class load assumptions, overwriting all nopable patch points. A String object sign bit is set to one for decompressed strings when compression enabled, and masking/testing this flag bit is noped. Alternative package protected string constructors and operations are provided. A predetermined location is checked to determine whether supplied arguments to a String class constructor are compressible is performed.

20 Claims, 8 Drawing Sheets

(56) References Cited

U.S. PATENT DOCUMENTS

2006/0200809 A1* 9/2006 Grcevski .............. G06F 8/443
                                                          717/140
2008/0147696 A1   6/2008 Ishizaki

OTHER PUBLICATIONS

Kawachiya et al., "Analysis and Reduction of Memory Inefficiencies in Java Strings," Proceedings of the 23rd Annual ACM SIGPLAN Conference on Object-Oriented Programming, Systems, Languages, and Applications, OOPSLA, Oct. 2008, pp. 385-401.

* cited by examiner

FIG. 4

Helper method 400

Statement
402

```
char getCharFromArrayByIndex(object obj, int index) {
if (IS_LITTLE_ENDIAN) {
 return (char)((((byte[])obj)[index] << 8) | ((byte[])obj)[index + 1]) } else
{
return (char)(((byte[])obj)[index + 1] | (((byte[])obj)[index] << 8)) }
}
void putCharInArrayByIndex(object obj, int index, char value) {
if (IS_LITTLE_ENDIAN) {
    ((byte[])obj)[index] = (byte)value
    ((byte[])obj)[index + 1] = (byte)(value >> 8)
} else {
    ((byte[])obj)[index] = (byte)(value >> 8)
    ((byte[])obj)[index + 1] = (byte)value
  }
}
```

FIG. 5

```
                                                  Test 502
                                                /
If (stringCompressionFlag == null && operand strings are compressed)
{algorithm for compressed strings
} else {                    Nopable string compression idiom
   algorithm for mixed strings            500
}
```

```
                                                  Helper method 504
private static bool isCompressed(String s) {
if (enableStringCompression && s.StringCompressionFlag == null) {
return s.count & (1 << 31);
} else {
return 0;
}
}
```

FIG. 7

```
                                                  Test 502
                                                /
If (enableStringCompressionFlag == null && operand strings are compressed)
{algorithm for compressed strings
} else {
   algorithm for mixed strings       Control field check 700
}
```

FIG. 8

```
char byteToCharUnsigned(byte b)        Helper method 800
{
Return (char)((char)b & 0xFF)
}
```

FIG. 6

String Object – *byte* array 600

| Length field with sign bit 602 | String representation storage of 2 bytes per character in UTF-16 604 |

Decompressed string 606

Enhanced String Object – *byte* array 608

| Length field with sign bit 610 | String representation storage of 8 bits per character in UTF-16 subset 612 |

Sign bit used as flag 616

Compressed string 614

FIG. 9

Heap usage 900

Web application under workload

| Class Name | Objects | Shallow Heap | Retained Heap |
|---|---|---|---|
| java.lang.String | 417,3## | 1#,###,### | |
| char[] | 326,53# | 25,799,### | |
| java.util.HashMapNode | 217,9## | 5,231,7## | |
| java.lang.Object[] | 128,3## | 5,###,42# | |
| com.ibm.ws.cache.InvalidateByIdEvent | 9#,2#3 | 5,3##,6## | |
| java.util.HashMap | 64,9## | 2,597,### | |
| java.util.HashMapNode[] | 62,#17 | 4,7#7,9## | |
| java.math.BigDecimal | 57,#21 | 1,###,#72 | |
| Total: | 2,6##,### | 125,5##,### | |

String objects 902

MULTI-BYTE COMPRESSED STRING REPRESENTATION

BACKGROUND

Technical Field

The present invention relates generally to character processing in a data processing system and more specifically to character processing using a multi-byte string representation in the data processing system.

Description of the Related Art

Current state-of-the-art implementation of the class library for java/lang/String (String) in high performance virtual machine implementations using Java® uses a char array as the backing storage to represent the String objects. The char data type is a two byte unsigned integer. (Java is a registered trademark of Oracle and/or its affiliates.) This representation intuitively makes sense because the Java programming language is based on the Unicode® character set and uses the UTF-16 character encoding for internal representation of textual data. (Unicode is a registered trademark of Unicode, Inc. in the United States and other countries.) Many languages can be represented using a character encoding which only uses the values 0-255 (e.g. a single byte) to represent all characters within the respective encoding. ISO8859-1 (Latin-1) is one such encoding and covers the entire Latin character set. One downside to using a char array as the backing storage for Strings in Java is that in this two byte-per-character representation the high-order byte is always zero for languages, which can be encoded using only values 0-255, for example, ISO8859-1. Moreover, for more complex String character encodings such as UTF-16, which does require an array of 16-bit chars as the backing storage, a Java virtual machine (JVM) and a user may never instantiate a String containing a character that requires more than 8 bits to represent, thus wasting allocated space in memory.

SUMMARY

According to an embodiment of the present invention, a computer-implemented method for multi-byte compressed string representation, comprises defining a package protected final static boolean control field, named enableStringCompression, in a String class, which identifies whether compression is one of enabled or disabled. Further the control field enableStringCompression is initialized on managed runtime startup. A package protected static control field, named stringCompressionFlag, is also defined, which identifies whether a decompressed string has ever been created when running with compression enabled.

In response to pattern matching by the compiler, noping entire tests based on a null setting of the stringCompressionFlag and registering a class loading assumption on a nop location are performed. In response to a determination of supplied arguments to a String class constructor not being compressible, the computer-implemented method creates a decompressed String and initializes the stringCompressionFlag static field.

Compiler-recognized intrinsically reducible endian-aware helper methods are defined for reading and writing byte and character values in an array. Compiler-recognized intrinsically reducible helper methods associated with widening, truncation, and masking operations for processing Strings in the enhanced Java virtual machine are also defined.

String class constructors, which collections of character values are enhanced to determine whether a supplied collection of characters is compressible. When the supplied collection of characters is determined to be uncompressible a decompressed String is created and the stringCompressionFlag static field is initialized causing all class load assumptions to be triggered, and overwriting all nopable patch points.

A sign bit of a count integer field of a String object is employed, the field representing the number of code-points a respective String object contains, as a flag bit set to one for decompressed string representations when compression is enabled. The masking and testing of this flag bit is noped using the stringCompressionFlag and an associated class load assumption.

A set of predetermined alternative package protected string constructors and operations is provided. A check of a predetermined location is performed to determine whether supplied arguments to a String class constructor are compressible.

BRIEF DESCRIPTION OF THE DRAWINGS

For a more complete understanding of this disclosure, reference is now made to the following brief description, taken in conjunction with the accompanying drawings and detailed description, wherein like reference numerals represent like parts.

FIG. 4 is a textual representation of a helper method used in accordance with one embodiment of the disclosure;

FIG. 5 is a textual representation of a nopable string compression idiom used in accordance with an embodiment of the disclosure;

FIG. 6 is a textual representation of a control field check method used in accordance with an embodiment of the disclosure;

FIG. 7 is a textual representation of a helper method used in char conversion in accordance with an embodiment of the disclosure;

FIG. 8 is a textual representation of string object heap usage used in accordance with an embodiment of the disclosure;

FIG. 9 is a block diagram representation of string objects used in accordance with an embodiment of the disclosure.

DETAILED DESCRIPTION

Figure 1:
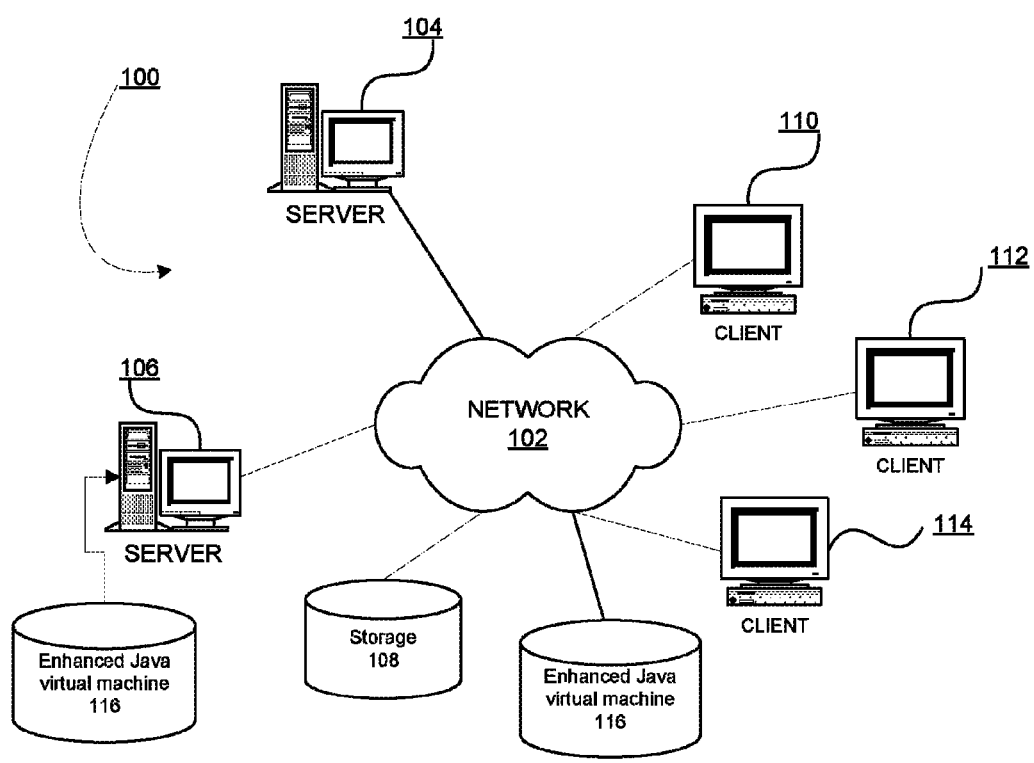
FIG. 1 is a block diagram of an exemplary network data processing system operable for various embodiments of the disclosure.

Embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
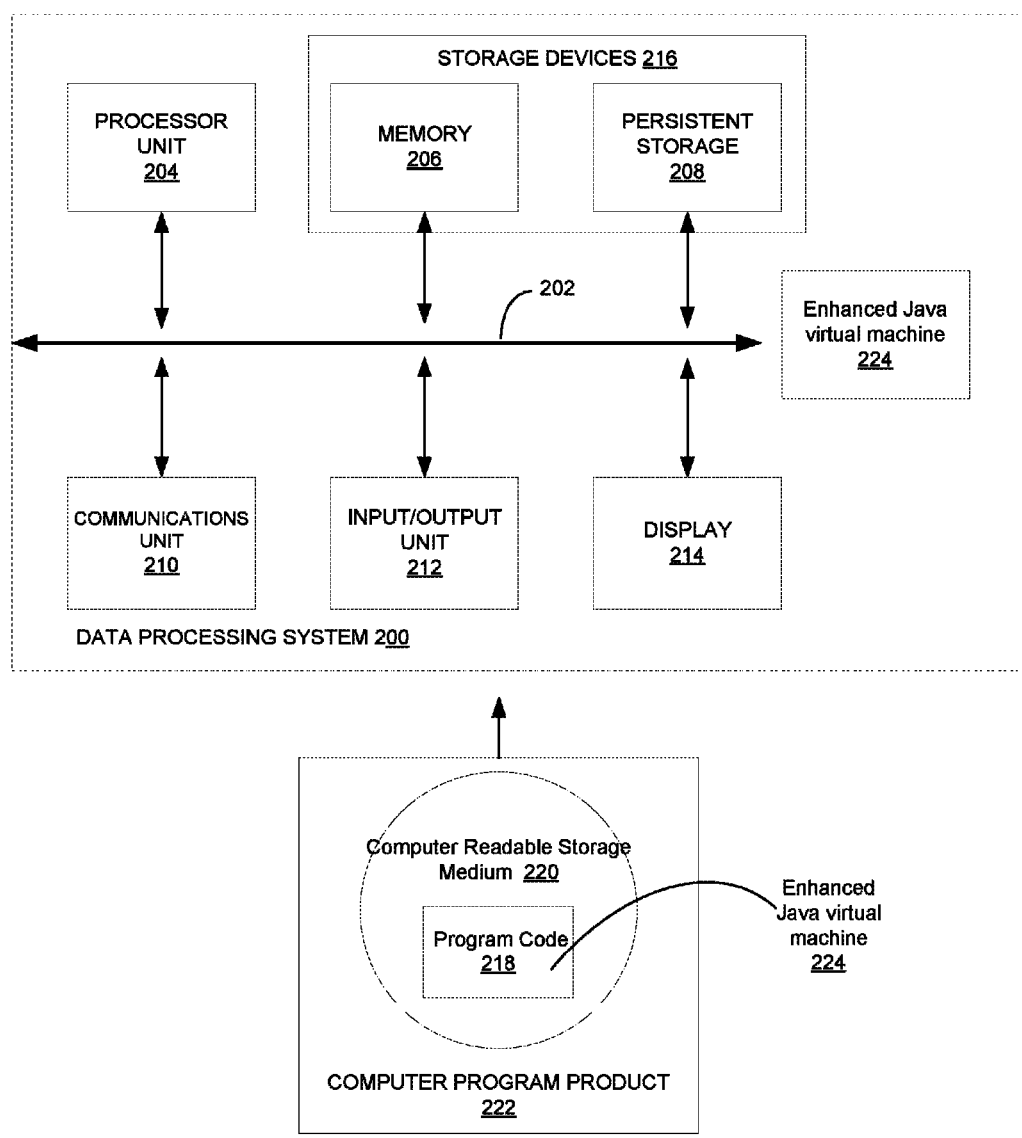
FIG. 2 is a block diagram of an exemplary data processing system operable for various embodiments of the disclosure.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 depicts a pictorial representation of a network of data processing systems in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown. Additional units of storage unit 108 are shown as enhanced Java virtual machine 116, which represent storage versions of program code available for download to deploy versions of enhanced Java virtual machine 116 on one or more of server 104 and server 106. In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

With reference to FIG. 2 a block diagram of an exemplary data processing system operable for various embodiments of the disclosure is presented. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices 216. A storage device is any piece of hardware that is capable of storing information, such as, for example without limitation, data, program code in functional form, and/or other suitable information either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard, a mouse, and/or some other suitable input device. Further, input/output unit 212 may send output to a printer. Display 214 provides a mechanism to display information to a user.

Instructions for the operating system, applications and/or programs may be located in storage devices 216, which are in communication with processor unit 204 through communications fabric 202. In these illustrative examples the instructions are in a functional form on persistent storage 208. These instructions may be loaded into memory 206 for execution by processor unit 204. The processes of the different embodiments may be performed by processor unit 204 using computer-implemented instructions, which may be located in a memory, such as memory 206.

These instructions are referred to as program code, computer usable program code, or computer readable program code that may be read and executed by a processor in processor unit 204. The program code in the different embodiments may be embodied on different physical or tangible computer readable storage media, such as memory 206 or persistent storage 208 or on computer readable storage media 220.

Program code 218 is located in a functional form on computer readable storage media 220 that is selectively removable and may be loaded onto or transferred to data processing system 200 for execution by processor unit 204. Program code 218 and computer readable storage media 220 form computer program product 222 in these examples. In one example, computer readable storage media 220 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable storage media 220 also may take the form of a persistent storage, such as a hard drive, a thumb drive, or a flash memory that is connected to data processing system 200. The tangible form of computer readable storage media 220 is also referred to as computer recordable storage media or a computer readable data storage device. In some instances, computer readable storage media 220 may not be removable.

In this example, computer program code 218 comprises program code representing enhanced Java virtual machine 224, which is an embodiment of enhanced Java virtual machine 116 of network data processing system 100.

Alternatively, computer program code 218 may be transferred to data processing system 200 from computer readable storage media 220 through a communications link to communications unit 210 and/or through a connection to input/output unit 212. The communications link and/or the connection may be physical or wireless in the illustrative examples.

In some illustrative embodiments, program code 218 may be downloaded over a network to persistent storage 208 from another device or data processing system for use within data processing system 200. For instance, program code stored in a computer readable data storage device in a server data processing system may be downloaded over a network from the server to data processing system 200. The data processing system providing program code 218 may be a server computer, a client computer, or some other device capable of storing and transmitting program code 218.

Using data processing system 200 of FIG. 2 as an example, a computer-implemented process for multi-byte compressed string representation is presented. Processor unit 204 defines a package protected final static boolean control field, named enableStringCompression, in a String class, which identifies whether compression is one of enabled or disabled. The control field enableStringCompression is initialized on managed runtime startup by processor unit 204. The managed runtime in the forthcoming examples is an enhanced Java virtual machine. A package protected static control field, named stringCompressionFlag, is also defined by processor unit 204, which identifies whether a decompressed string has been created when running with compression enabled.

In response to pattern matching by the compiler, processor unit 204 nops entire tests based on a null setting of the stringCompressionFlag and registers a class loading assumption on a nop location. In response to a determination of supplied arguments to a String class constructor not being compressible, processor unit 204 creates a decompressed String and initializes the stringCompressionFlag static field.

Processor unit 204 defines compiler-recognized intrinsically reducible endian-aware helper methods for reading and writing byte and character values in an array. Processor unit 204 also defines compiler-recognized intrinsically reducible helper methods associated with widening, truncation, and masking operations for processing Strings in the enhanced Java virtual machine.

Processor unit 204 also enhances String class constructors, which accept collections of character values to determine whether a supplied collection of characters is compressible. When processor unit 204 determines the supplied collection of characters to be uncompressible, processor unit 204 creates a decompressed String and the stringCompressionFlag static field is initialized causing all class load assumptions to be triggered, and overwriting all nopable patch points.

Processor unit 204 is also aware of a sign bit of a count integer field of a String object, representing a number of code-points a respective String object contains, as a flag bit which is set to one for decompressed string representations when compression is enabled. The masking and testing of this flag bit is noped by processor unit 204 using the stringCompressionFlag and an associated class load assumption.

Processor unit 204 also provides a set of predetermined alternative package protected string constructors and operations. Processor unit 204 also checks a predetermined location to determine whether supplied arguments to a String class constructor are compressible.

An embodiment of the present invention therefore provides a technical solution as a novel approach to reduce the memory consumption of Java programs, by focusing on string memory inefficiencies when representing character strings encoded in a multi-byte character set, for example, UTF-16, while only using a single byte of storage per character for specific locales that use primarily or only character values 0-255 (such as Latin-1). The technical solution provides a reduced memory footprint, relative to prior solutions and also provides an efficient processing environment. The embodiments preserve an illusion, to all public string application programming interfaces (APIs), that the internal representation is stored in a multi-byte character encoding. The embodiments typically provide zero throughput overhead when string compression is disabled and when all strings are compressed. Thus, a path length and a throughput penalty only exist when strings are a heterogeneous mix of compressed and decompressed representations. Therefore embodiments of string compression, as will be described, typically provide meaningful throughput and footprint advantages while not penalizing users who require decompressed string representations to accommodate particular character set encodings.

Figure 3:
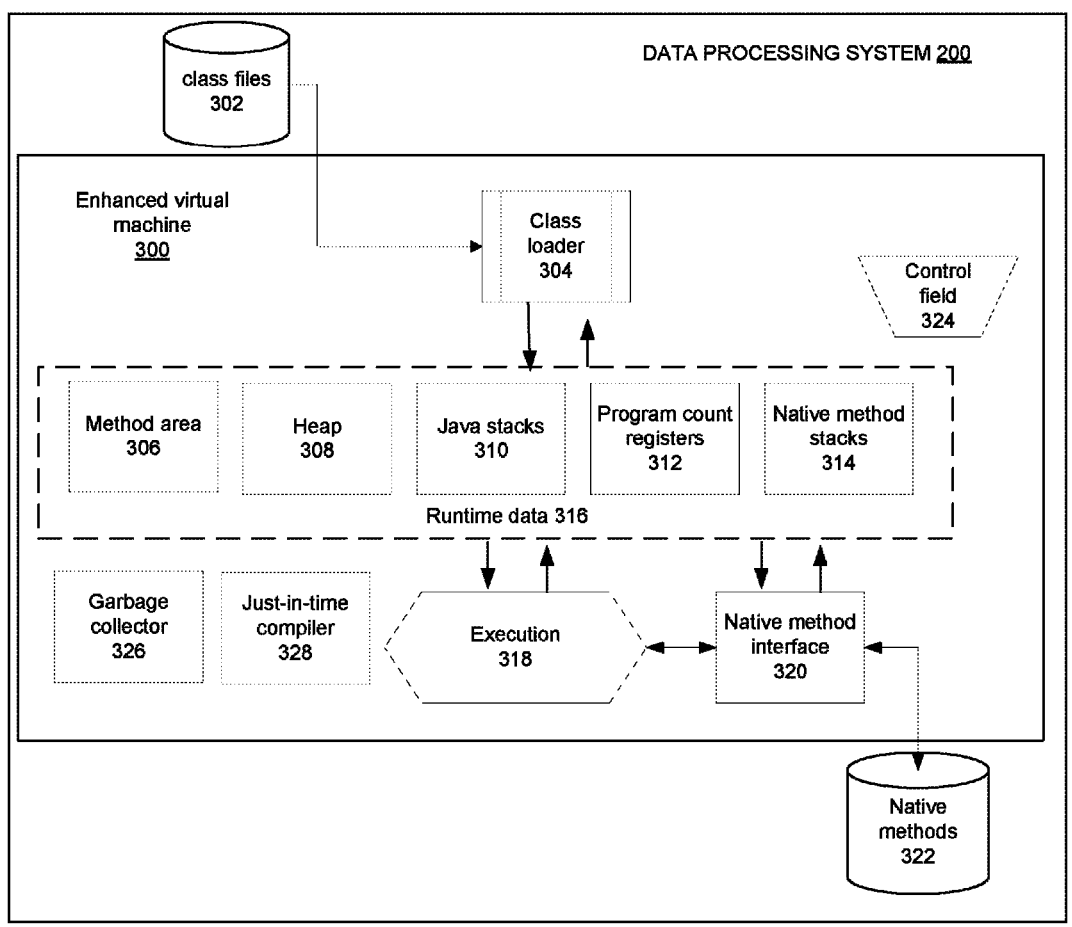
FIG. 3 is a block diagram representation of an enhanced Java virtual machine operable for various embodiments of the disclosure.

With reference to FIG. 3 a block diagram of an enhanced Java virtual machine operable for various embodiments of the disclosure is presented. Enhanced Java virtual machine 300 is an example of a Java virtual machine according to an embodiment of the disclosure. Enhancements incorporate technical features typically enabling a reduction in the memory consumption of Java programs, by focusing on string memory inefficiencies when representing character strings encoded in a multi-byte character set.

Components of enhanced Java virtual machine 300, include, but are not limited to class loader 304, method area 306, heap 308, Java stacks 310, Program count registers 312, native stacks 314, runtime data 316, execution 318, native method interfaces 320, control field 324, garbage collector 326 and just-in-time compiler 328. Class files 302 and native methods 322, are important data structures used in conjunction with enhanced Java virtual machine 300, but are not 'within' enhanced Java virtual machine 300 as are the previously stated components. These components represent the important subsystems and memory areas of a typical Java virtual machine as described in any version of the specification.

Class loader 304 is a component of a Java virtual machine that provides a mechanism for loading the types, which are classes and interfaces, using fully qualified names. Class files 302 are therefore loaded into enhanced Java virtual machine 300 for processing using class loader 304.

Runtime data 316, represents space in memory used to store data comprising bytecodes, information extracted from from previously loaded class files, objects instantiated by an executing program, parameters provided to methods, return values associated with executing programs, and local variables associated with executing programs. Enhanced Java virtual machine 300 typically organizes memory used to execute programs into a number of runtime data areas comprising method area 306, heap 308, Java stacks 310, Program count registers 312, and native stacks 314.

Method area 306, represents a memory area that is shared by all threads running inside enhanced Java virtual machine 300. When enhanced Java virtual machine 300 loads a particular class file, the particular class file is parsed for information about a type from the binary data contained within the class file. The type information is loaded into method area 306. During program execution, enhanced Java virtual machine 300 stores all program instantiated objects onto heap 308.

Program counter registers 312, and Java stacks 310 are assigned to a new thread when the new thread is created.

When the thread is executing a Java method, rather than a 'native method,' a value of program counter registers 312 is the next instruction for the thread to execute. Java stacks 310 stores the state of Java method invocations, but not the 'native method,' invocations for the thread. The state of a Java method invocation typically includes local variables, invocation parameters, a return value when available and any intermediate calculation results from the method. Because the Java virtual machine does not have registers to hold data values as intermediate data, Java stacks 310 are used. The state of 'native method' invocations is stored in an implementation-dependent way in native stacks 314, and implementation-dependent memory areas.

Execution 318 represents an execution or processing component that provides a capability for executing the instructions contained in the methods of classes, loaded by class loader 304.

Native method interfaces 320, provide a capability to the enhanced Java virtual machine 300 to use native methods 322 which are written using a Java programming language and may have platform specific data or processing requirements. Access to the native methods 322 therefore requires use of native method interfaces 320 to enable processing using execution 318.

Control field 324 is a specific enhancement provided in an implementation of an embodiment of the present invention. The use of a static control field in the form of control field 324 enables compression to be globally disabled 'inexpensively' in terms of virtual machine resources and processing cycles when the virtual machine is initiated. While a control flag may exist in the virtual machine itself, the control field has to be represented in the Java String representation so the values of the control field can be used in the String application programming interface implementation.

Garbage collector 326 is special component, which uses a process of reviewing current allocations of heap memory. Garbage collector 326 identifies which particular objects in the heap memory are in use and which particular objects in the heap memory are not in use. Objects identified as not in use are candidates for removal. Garbage collector 326 deletes the unused objects. Garbage collector 326 typically operates on a predetermined schedule or may also be automated to initiate cleaning activity when heap usage exceeds a predetermined threshold. Objects identified as in use or referenced imply that a program still maintains a pointer to that object, and the object should remain in the heap.

Just-in-time compiler 328 (JIT) is a runtime component providing a capability of dynamic translation, which is compilation during execution of a program rather than prior to the execution. Typically just-in-time compiler 328 translates the Java bytecode to platform specific machine code. The run time compilation may be viewed as a combination of ahead-of-time compilation (AOT), and interpretation. JIT compilation provides speed of compiled code with flexibility of an interpretation. However JIT compilers also come with overhead of using the interpreter and additional overhead of compiling.

With regard to current Java virtual machine implementations, String compression typically refers to eliminating all high-order byte zeros from an internal string representation when none of the characters in the string representation require use of the high-order byte for their representation. Benefits of String compression are, in a first case, when using a byte array as the String backing storage, memory use is more efficient than using a char array because the memory footprint of representing a String is approximately half, because the String object itself includes some memory overhead. Using a byte array also has a benefit of faster allocation, faster copying, and faster garbage collection, than typical relative to using a char array. In a first case many publically exposed operations on String objects can now be simplified when an operation is performed on compressed Strings. Because compressed Strings are composed of character sequences represented in an 6-bit subset of UTF-16, algorithms used to express some of String operations no longer have to perform the respective operation on a full range of Unicode characters. This relaxed requirement simplifies the implementation of algorithms including uppercasing a String, lowercasing a String, searching for code point indices, and handling of surrogate pairs among other String operations.

Embodiments of the present invention advance the idea of string compression using a specific combination of non-obvious techniques, which typically provide improved performance with lowest memory overhead relative to other previous techniques.

Embodiments of the present invention represent strings encoded in a multi-byte character set, for example, UTF-16, while only using a single byte of storage per character for locales which typically or primarily use only character values in a range from 0-255 (e.g. the Latin-1 coded character set). Further, an implementation of an embodiment preserves an illusion, to all public string application programming interfaces, that the internal representation of characters is stored as a multi-byte character encoding. Elements of embodiments of the present invention include techniques to read and write two-byte characters to and from a byte array using single native instructions that couple with a Java code implementation for the interpreter of an enhanced JVM, which also obeys platform endianness (platform hardware specific byte ordering memory model).

Another element includes making 'flag tests' nopable patch points until the very first decompressed string is created thereby eliminating the overhead of compression tests while strings are homogeneously compressed.

Another element includes recognition that a sign bit of a length field associated with a string can be used safely as a flag to mark an associated string as having a decompressed representation when compression is enabled for the JVM. In another alternate embodiment, a separate field may be used to contain the flag to mark an associated string as having a decompressed representation when compression is enabled for the enhanced JVM. An enhanced JVM also includes another element, of an embodiment, in the addition of a static control field to enable string compression to be globally disabled inexpensively in terms of virtual machine resources when a virtual machine is initialized.

Another element includes a set of techniques to bypass the normal sign extension algorithm of Java, which requires a byte to char conversion to sign extend the byte to int, then mask and truncate the int to char.

In the following examples of this description an embodiment, by way of example, is provided in a context in which the character datatype is a double byte matching the UTF-16 encoding representative of the situation in Java. Handling a character representation wider than 16-bits typically requires only minor changes to the embodiment described.

One of the most trivial and obvious means of implementing string compression makes the String object backed by a byte array when compressed and a char array when decompressed. While seemingly obvious, these mixed object types typically incur significant performance penalties. Before a character can be read or written it is necessary to cast the type of the backing data store, which in general, requires a runtime type test. These runtime type tests are expensive and make code generation more difficult. Instead, embodiments of the present invention recognize that a char array is equivalent to a byte array of twice the length where elements are read and written in pairs with a byte ordering which respects native endianness of the implementing platform. Reading and writing chars to a byte array can be expressed explicitly in an implementation language by means of bit shifting and bitwise logical operations. Embodiments of the present invention encapsulate these operations in private helper methods of the String class, for example, helper method 400, which follows.

Embodiments of the present invention further provide a public application-programming interface modified to compress strings, as much as possible, when compression is enabled, to try to avoid creating decompressed strings. In addition, package protected methods which accept compressed data are provided to allow for a more efficient hookup with implementations of other classes, which are tightly couple to String, including StringBuffer, StringBuilder, Integer, and Double.

The public application-programming interface implementations, in the embodiments, also include an additional internal implementation specialized for compressed strings for performance, with a fallback to existing algorithms when dealing with decompressed strings. These existing implementations use predetermined compiler-recognized, intrinsically reducible helper methods to read/write chars to allow the public application-programming interface implementations to work seamlessly with compressed and decompressed representations. The predetermined compiler-recognized intrinsically reducible helper methods are high performant because of the various JIT compiler techniques described in an embodiment of this invention.

With regard to FIG. 4, a textual representation of a helper method used in accordance with one embodiment of the disclosure is shown. The code snippet of helper method 400 is an example of a private helper method of the String class in enhanced Java virtual machine 300 of FIG. 3.

Just-in-time compiler 328 of FIG. 3 enables portions of embodiments of the present invention to typically improve performance, relative to previous techniques, by recognizing helper methods to generate native machine instructions. However embodiments of the present invention also encompass ahead-of-time compilation as well as just-in-time compilation examples as used herein. Therefore one skilled in the art would realize that while embodiments of the present invention may be implemented as part of a just-in-time compiler, those embodiments are only one example of a compilation system which can employ and benefit from embodiments of the present invention.

Statement 402 makes use of IS_LITTLE_ENDIAN which is a static final boolean flag initialized by enhanced Java virtual machine 300 at startup to be true when the underlying machine architecture has a little endian memory model and false when the underlying machine architecture has a big endian memory model. The net effect of helper method 400 is that character width operations on the byte array are encoded via methods such as helper method 400. In a compiler these special helper methods are recognized and cause a specific hardware instruction to be generated to directly read or write a character width value to the appropriate location in the byte array. This means that reading and writing a character width value is a single instruction as is reading and writing a byte value directly.

With regard to FIG. 5 a textual representation of a nopable string compression idiom used in accordance with one embodiment of the disclosure is presented. The code snippet of nopable string compression idiom 500 is an example of code used to perform a check for a string using a compressed representation for its character values. Although in the code snippet example a test 502 of 'operand strings are compressed' is not directly executable code, this test may be addressed using a helper function of the form shown as helper method 504.

To achieve high performance operations using strings when compression is enabled requires that testing/checking for compression be eliminated when not truly required, that is until the very first decompressed string is created. Although this check can be performed explicitly, such a compression check will always succeed when a decompressed string is has yet to be created, thus having to explicitly carry out the check can be avoided right up to a point when a first decompressed string is created.

A particular variant of noping of null tests involving a static of an uninitialized declared type is introduced as a nopable string compression flag in an implementation of an embodiment. The nopable string compression flag shown as stringCompressionFlag, is defined as a package protected nested class in String with a lazily initialized package protected static field of the said type. During static initialization the static field is initialized to null. The operations defined in the String class must then employ nopable string compression idiom 500. The compiler recognizes nopable string compression idiom 500 by pattern matching a null check of the string compression flag type and nops the entire check in the if statement and registers a class loading assumption on this specific nop location. This effectively has zero runtime overhead because the checks in the if statement are never executed. When a class corresponding to stringCompressionFlag is first loaded the registered assumptions on the noped checks are triggered and the noped check is patched with a branch to a fallback block. The fallback block will explicitly execute the check in the if statement and branch to a correct algorithm implementation for the state of string compression.

With regard to FIG. 6 a bock diagram representing a string data structure used in accordance with one embodiment of the disclosure is presented. String object—byte array 600 is an in-memory example of decompressed string 606, has length field with sign bit 602 and stores string representation storage of 2 bytes per character in UTF-16 604. String object—byte array 608 is an in memory example of compressed string 614 has length field with sign bit 610 and stores string representation storage of 8 bits per character in UTF-16 subset 612.

Because Java is an object-oriented language all string objects are initialized using the String class constructors. The String class constructors provide a convenient place to check whether supplied arguments to the String class constructor are compressible. If the supplied arguments to a String class constructor are not compressible then a decompressed String is created and the stringCompressionFlag static field is initialized causing all the class load assumptions to be triggered and hence all nopable patch points to be overwritten.

When compression is enabled and decompressed string 606 is created the implementation of the string application programming interfaces distinguish between strings backed by compressed data representations or decompressed data representations. Continuing with the example embodiment, the count field of the String object, which holds the number of characters in the representation of String, is a signed integer, but is never validly negative. Therefore, the sign bit of this integer, as in length field with sign bit 602 or length field with sign bit 610 is used as a flag for a decompressed string representation. Re-use of the sign bit as a flag avoids String object enlargement to accommodate the flag. Adopting a convention that the flag is only set to one for decompressed string representations created when compression is enabled, avoids having to mask the count field before use until the first decompressed string is created when compression is enabled. The flag is always clear when compression is disabled because compressed string 614 will not be created. In essence the meaning of the flag is that the internal encoding of String is the opposite of a currently enabled compression mode. In an alternative embodiment, a boolean flag field is added to a String object, rather than re-using the sign bit. The boolean flag field increases the size of a String object, because, in Java programming, a boolean field is stored as a 4-byte integer value, which requires more memory when used.

With regard to FIG. 7, a textual representation of a control field check method used in accordance with one embodiment of the disclosure is presented. The code snippet of control field check 700 is an example of using a special control field to check the state of a compression mode used in an embodiment of the present invention. Although in the code snippet example a test 702 of 'operand strings are compressed' is not directly executable code. This test may be addressed using a helper function of the form shown as helper method 504 in FIG. 5.

Certain locales contain commonly used characters which cannot be represented in a 0-255 character encoding range. These particular locales would not benefit from string compression because the character encoding is predominantly running in a mixed representation mode. To alleviate the overhead of running in mixed representation mode, when certain that decompressed strings will be created under a user locale, an implementation of an embodiment defines a package protected final static boolean control field in the String class. The package protected final static boolean control field identifies whether compression is enabled or disabled. This package protected final static boolean control field is initialized on JVM startup using an option. This control field enables global disabling of String compression using the code snippet of control field check 700 in String compression related code. Rather than the global compression enable/disable being based on an option, other techniques can be used. For example, the virtual machine could inspect the user environment to determine a suitable default state. Continuing this example, a technique of locale detection may be used to make the determination.

The compiler recognizes this field as being final and would fold away the check when the enableStringCompression field is true or fold away the fall-through if block when the enableStringCompression field is false. This field thus typically has zero performance overhead when a corresponding method is compiled and provides a convenient way to disable string compression at JVM startup at no cost to a user. The enableStringCompression field does not need to be a separate field. In an alternate embodiment, any spare bit in a global field could be used. Similarly with regard to the count field sign bit being used as a flag, any other spare bit in the String object or it's uniquely owned (i.e. unshared) data representation could be used for the flag.

With regard to FIG. 8, a textual representation of a helper method used in char conversion in accordance with one embodiment of the disclosure is presented. Code snippet of helper method 800 is an example of an unsigned widening conversion from a byte to a char.

The JVM specification regarding casting between primitive types requires widening conversions from a byte to a char must happen through an int because a byte is a signed primitive type and a char is an unsigned primitive type. Thus the conversion from a byte to a char requires a sign extension to an int and a truncation. For the purposes of string compression this is not desired when attempting to cast a compressed byte to a decompressed char as we want to perform an unsigned widening. Thus the conversion and mask out of the high order 8-bits is required to simulate unsigned widening. This logic is implemented by helper method 800.

This widening, truncation, and masking is wasteful because most underlying hardware implementations support single byte to double byte unsigned widening with a native instruction. Some hardware implementations also support loading a single byte and unsigned extending to a double byte directly from memory. The hardware implementations are exploited by recognizing the example of helper method 800 in the compiler and emitting the hardware specific instruction for carrying out the unsigned widening or unsigned widening and loading from memory when helper method 800 or similar is used directly on an array access.

Some String class library implementations internally contain an offset field representing the offset of the first code point in the backing array. The purpose of the offset field is to avoid allocation and copying of the backing array when a substring operation is performed with a non-zero start index. The string compression implementation described in the example embodiments eliminates this field. Empirical evidence shows that a memory footprint reduction achieved through eliminating the offset field from the String class is typically more beneficial than what is gained by eliminating extra allocations and array copies. The elimination of the offset field also has a side effect of simplifying some of the mathematical operations performed in many of the publically exposed string application programming interfaces. Attempting to eliminate the count field however has a net negative affect on performance because the count field is a useful component in sharing a backing array between the String class and the StringBuilder and StringBuffer classes in the same package. Moreover implementation of the embodiments of string compression uses the sign bit of the count field as a flag for marking decompressed strings. The backing array does not need to be a byte array. In the examples of an embodiment, a byte array is used for convenience. Individual compressed character byte representations could be packed into a char array, int array or any other primitive integral array type, however the bytes need to be packed in when writing and the bytes unpacked when reading. A block of memory of the correct size that the current application alludes to can be used.

Implementations of embodiments of the present invention typically perform better relative to all other designs and formulations of solutions to the problem of string compression. Implementations of embodiments of the present invention have zero overhead compared to current implementations when string compression is disabled. Implementations of embodiments of the present invention have zero overhead, when compression is enabled, and no decompressed strings are created. In cases where compressed and decompressed strings are both present on the heap, the runtime checks are still simple and typically provide increased performance where a number of compressed strings greatly outnumber a number of decompressed strings. Alternative designs and implementations typically have an overhead for decompressed strings in addition to overhead in a mixed mode case. This means the alternative implementations penalize users of double-byte character sets including Japanese, Chinese, Korean, and Arabic.

With regard to FIG. 9, a textual representation of string object heap usage used in accordance with one embodiment of the disclosure is presented. Heap usage 900, is an example of heap usage of a typical application server. For example, the data shown in heap usage 900 may be representative of a web application under a particular workload level.

The benefit of an implementation of an embodiment of the present invention for performing compression is two-fold. First the size of the String object is reduced through removal of the offset field and not requiring an additional field for a compression flag. Second, the character array compression reducing footprint and increasing string operation throughput.

Heap usage 900, illustrates by reducing String object 902 by 8 bytes typically saves 417,900 objects*8 bytes which is approximately 3.3 MB out of roughly 125 MB. Compressing all of the character arrays will approximately halve the amount of space occupied by the character arrays resulting in savings of approximately 12.5 MB. This is a savings of approximately 12.5% in terms of the heap space. These heap space savings are especially relevant in cloud operating environments where reduced heap consumption enables greater packing of virtual machines on server farms and associated reduction in operating costs.

Embodiments of string compression of the present invention also have throughput advantages because the embodiments also reduce garbage collection (GC) time since less space in memory is consumed and because the embodiments typically simplify the operation of a number of common string operations including toUpper and toLower since there is longer a need to consider items including surrogate pairs, and code points.

Embodiments of string compression of the present invention also have the potential to enable an increase in the amount of data stored in a shared class cache, which will aid ramp up of a virtual machine, and throughput scenarios in addition to the performance gains expected from simplified string implementation and reduced garbage collection (GC) activity.

Figure 10:
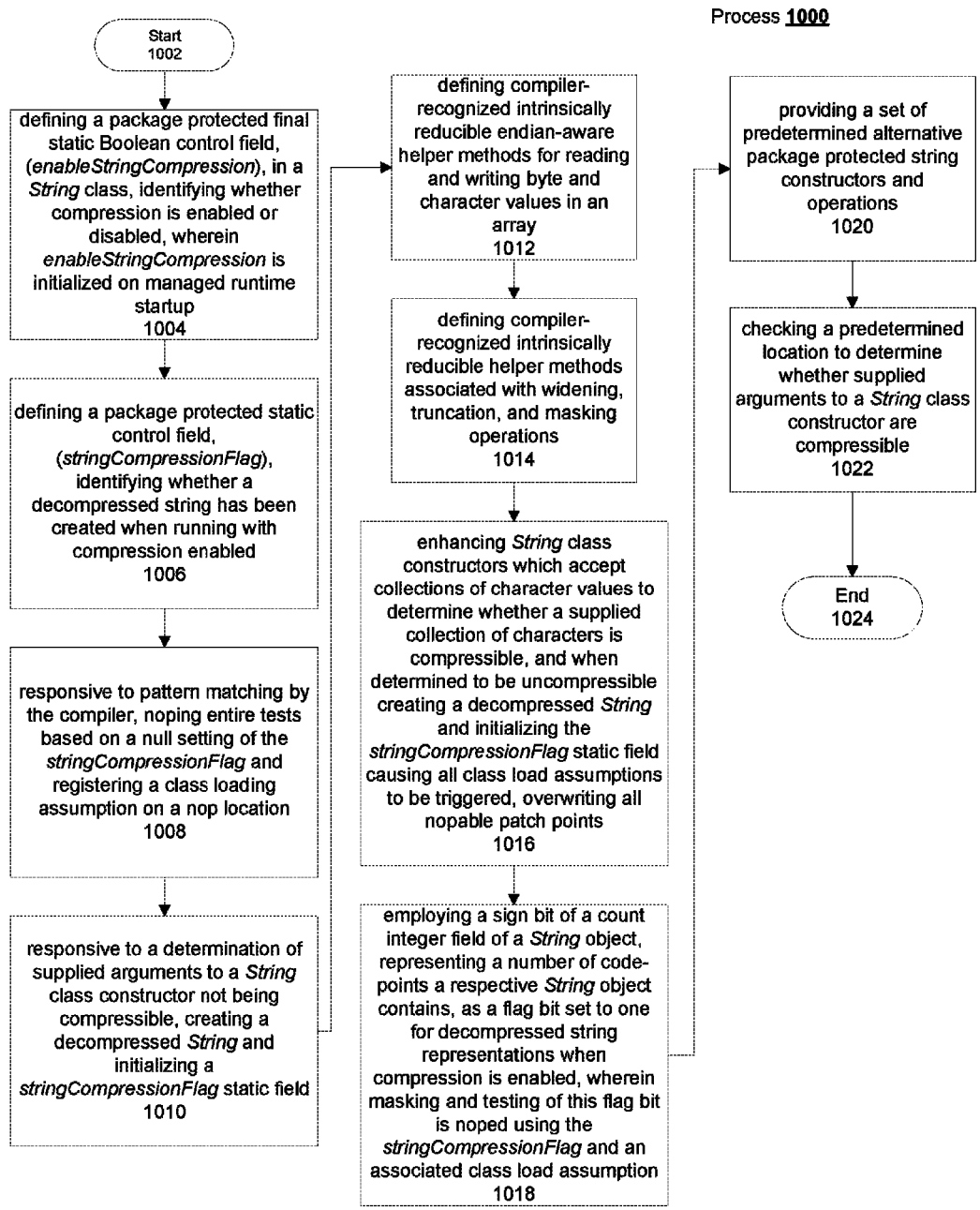
FIG. 10 is a flowchart of a process multi-byte compressed string representation using enhanced Java virtual machine 300 of FIG. 3 in accordance with an embodiment of the disclosure.

With regard to FIG. 10, a flowchart of a process for multi-byte compressed string representation, used in accordance with one embodiment of the disclosure, is presented. Process 1000 is an example of using an embodiment of string compression using a multi-byte compressed string representation using enhanced Java virtual machine 300 of FIG. 3.

Process 1000 is an example of an embodiment of a computer-implemented method for multi-byte compressed string representation. Process 1000 starts (step 1002) in response to a request (explicit or implied) to process a String (explicit or implied) and defines a package protected final static boolean control field (step 1004). The control field enableStringCompression, is in a String class, and identifies whether compression is one of enabled or disabled. The control field enableStringCompression is initialized on managed runtime startup. In the examples used, the managed runtime is an enhanced Java virtual machine.

Process 1000 continues and defines a package protected static control field (step 1006). This control field, stringCompressionFlag, identifies whether a decompressed string has been created when running with compression enabled. In response to pattern matching by the compiler, process 1000 continues by noping entire tests based on a null setting of the stringCompressionFlag and registering a class loading assumption on a nop location (step 1008). The class load assumption for patching the nop, used in the embodiments described, is just one technique for creating a nop and associating an event that will be reported by the VM to the JIT to indicate a patch is needed. A number of other techniques could be used as well.

In response to a determination of supplied arguments to a String class constructor not being compressible, process 1000 continues by creating a decompressed String and initializing the stringCompressionFlag static field (step 1010). Process 1000 further defines compiler-recognized intrinsically reducible endian-aware helper methods for reading and writing byte and char values in an array (step 1012). Process 1000 further defines compiler-recognized intrinsically reducible helper methods associated with widening, truncation, conversion and masking operations (step 1014). Conversion in this sense is viewed as character conversion. For example, case Latin-1 is a subset of UTF-16 and a widening function or a truncation function can readily convert to and from UTF-16. If the compressed representation was using an EBCDIC encoding or another encoding then a native instruction could perform the transformation and the same intrinsic would still be needed to exploit that operation which would have a non-trivial Java implementation.

Process 1000 enhances String class constructors which accept collections of character values to determine whether a supplied collection of characters is compressible, and when determined to be uncompressible creating a decompressed String and initializing the stringCompressionFlag static field causing all class load assumptions to be triggered, overwriting all nopable patch points (step 1016). Process 1000 further employs a sign bit of a count integer field of a String object, representing a number of code-points a respective String object contains, as a flag bit set (step 1018). The flag bit is set to one for decompressed string representations when compression is enabled. The masking and testing of this flag bit is noped using the stringCompressionFlag and an associated class load assumption.

When a decompressed string is first created, in an alternative embodiment, the system could "stop-the-world", i.e. halt all execution, check the size of all compressed strings and then decompress all representations to perform a switch from running a mode of uniformly compressed strings to uniformly uncompressed strings at a cost of the first decompression being very expensive. It is also possible that decompression could fail when there is insufficient space. This example is an alternative design point, which would avoid mixed mode operation, however with a much higher overhead when a decompressed string is created for the first time than the embodiments presented.

In another alternate embodiment, when the garbage collector runs a global collect, the garbage collector could check whether the string representation has become globally uniform (i.e. all strings are compressed or all strings are uncompressed) or that all strings could be made globally uniform (by decompressing compressed strings or compressing decompressed strings). In this scenario, the representation of all string objects could be made uniform and reset the nop patch points/recompile the String methods to make the implementation high speed again for the current representation and wait for the representation to become non-uniform again before patching the nop points again to add the necessary checks back into use.

Process 1000 provides a set of predetermined alternative package protected string constructors and operations (step 1020). Process 1000 checks a predetermined location to determine whether supplied arguments to a String class constructor are compressible (step 1022) and terminates thereafter.

In another alternate embodiment, in addition to preserving the existing string application programming interfaces, the application programming interfaces could be augmented to provide access directly to the compressed string representation (returning bytes rather than chars for example) for those implementations wanting to exploit compressed string data for performance. These new interfaces would have to throw exceptions when the representation is uncompressed and does not support the requested operation.

In another alternate embodiment, in terms of implementing compression efficiently, a related but different idea creates a string implementation class. The String class delegates all operations to an instance of this abstract implementation class and there would be two implementations. One implementation, which would use a compressed representation, and another, which would not. The nopable tests, the alternate embodiment, would then be more traditional in-lined virtual method call guards. However this technique would typically have a higher memory footprint than currently described embodiments.

In another alternate embodiment, an implementation may choose to have multiple compressed string representations using more indicator bits in the object to test which particular representation exists. The same test noping and other ideas previously described could be used to eliminate these tests when homogeneous representations were found. This example may enable a platform to have EBCDIC encoded strings, ASCII encoded strings, and UTF-16 encoded strings all coexisting with conversions performed only where the different string representations interact. This alternate embodiment may have a higher overhead on some string operations, but balanced by footprint and conversion-on-creation savings, when compared to the previously described embodiments.

As a result, this combination of elements typically yields benefits greater than a sum of parts. The combination, when implemented as in an embodiment, provides zero overhead when compression is globally disabled and when all strings are in a compressed representation. The overhead for handling mixed compressed and decompressed representations is only incurred when a first decompressed string is created.

Thus is presented in an illustrative embodiment a computer-implemented process for string compression. The computer-implemented method for multi-byte compressed string representation, comprising defining a package protected final static boolean control field, named enableStringCompression, in a String class, which identifies whether compression is one of enabled or disabled. Further the control field enableStringCompression is initialized on managed runtime startup. The managed runtime in the previous examples is an enhanced Java virtual machine. A package protected static control field, named stringCompressionFlag, is also defined by embodiments of the computer-implemented method, which identifies whether a decompressed string has been created when running with compression enabled.

In response to pattern matching by the compiler, noping entire tests based on a null setting of the stringCompressionFlag and registering a class loading assumption on a nop location are performed by embodiments of the computer-implemented method. In response to a determination of supplied arguments to a String class constructor not being compressible, the computer-implemented method creates a decompressed String and initializes the stringCompressionFlag static field.

Embodiments of the computer-implemented method define compiler-recognized intrinsically reducible endian-aware helper methods for reading and writing byte and character values in an array. Embodiments of the computer-implemented method also defines compiler-recognized intrinsically reducible helper methods associated with widening, truncation, and masking operations for processing Strings in the enhanced Java virtual machine.

Embodiments of the computer-implemented method also enhance String class constructors, which accept collections of character values to determine whether a supplied collection of characters is compressible. When embodiments of the computer-implemented method determine supplied collection of characters to be uncompressible a decompressed String is created and the stringCompressionFlag static field is initialized causing all class load assumptions to be triggered, and overwriting all nopable patch points.

Embodiments of the computer-implemented method also employ a sign bit of a count integer field of a String object, representing a number of code-points a respective String object contains, as a flag bit set to one for decompressed string representations when compression is enabled. The masking and testing of this flag bit is noped using the stringCompressionFlag and an associated class load assumption.

Embodiments of the computer-implemented method also provide a set of predetermined alternative package protected string constructors and operations. Embodiments of the computer-implemented method also check a predetermined location to determine whether supplied arguments to a String class constructor are compressible.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing a specified logical function. It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention can take the form of an entirely hardware embodiment, an entirely software embodiment or an embodiment containing both hardware and software elements. In a preferred embodiment, the invention is implemented in software, which includes but is not limited to firmware, resident software, microcode, and other software media that may be recognized by one skilled in the art.

It is important to note that while the present invention has been described in the context of a fully functioning data processing system, those of ordinary skill in the art will appreciate that the processes of the present invention are capable of being distributed in the form of a computer readable data storage device having computer executable instructions stored thereon in a variety of forms. Examples of computer readable data storage devices include recordable-type media, such as a floppy disk, a hard disk drive, a RAM, CD-ROMs, DVD-ROMs. The computer executable instructions may take the form of coded formats that are decoded for actual use in a particular data processing system.

A data processing system suitable for storing and/or executing computer executable instructions comprising program code will include one or more processors coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

What is claimed is:

1. A computer-implemented method for multi-byte compressed string representation, the computer-implemented method comprising:
    defining a package protected final static boolean control field, enableStringCompression, in a String class, which identifies whether compression is one of enabled or disabled, wherein enableStringCompression is initialized on managed runtime startup;
    defining a package protected static control field, stringCompressionFlag, which identifies whether a decompressed string has been created when running with compression enabled;
    in response to pattern matching by a compiler, noping entire tests based on a null setting of the stringCompressionFlag and registering a class loading assumption on a nop location;
    in response to a determination of supplied arguments to a String class constructor not being compressible, creating a decompressed string and initializing a stringCompressionFlag static field;
    defining compiler-recognized intrinsically reducible endian-aware helper methods for reading and writing byte and character values in an array;
    defining compiler-recognized intrinsically reducible helper methods associated with widening, narrowing, truncation, conversion and masking operations;
    enhancing String class constructors which accept collections of character values to determine whether a supplied collection of characters is compressible, and when determined to be uncompressible creating a decompressed string and initializing the stringCompressionFlag static field causing all class load assumptions to be triggered, overwriting all nopable patch points;
    employing a sign bit of a count integer field of a String object, representing a number of code-points the respective String object contains, as a flag bit set to one for decompressed string representations when compression is enabled, wherein masking and testing of this flag bit is noped using the stringCompressionFlag and an associated class load assumption;
    providing a set of predetermined alternative package protected string constructors and operations; and
    checking a predetermined location to determine whether supplied arguments to a String class constructor are compressible.

2. The computer-implemented method of claim 1, wherein enableStringCompression is initialized on managed runtime startup using an option setting.

3. The computer-implemented method of claim 1, wherein enableStringCompression control field enables globally disabling string compression, and wherein a compiler recognizes this field as being a static final and folds away all expressions that can be simplified with a compile time static final value of enable String Compression.

4. The computer-implemented method of claim 1, wherein a type of the enableStringCompression control field has a type that is defined as a package protected nested class in String, and wherein a default value of the enableStringCompression control field is null, and wherein a class of the enableStringCompression control field only being loaded when a decompressed string is first created.

5. The computer-implemented method of claim 1, wherein in response to pattern matching by the compiler, noping entire tests based on a null setting of the stringCompressionFlag and registering a class loading assumption on a nop location, when a class corresponding to the stringCompressionFlag is first loaded, patching nop locations to run checks which were, prior to class loading, guaranteed to always result in a same answer.

6. The computer-implemented method of claim 1, wherein in response to a determination of supplied arguments to a String class constructor not being compressible, creating a decompressed string and initializing a stringCompressionFlag static field further comprising causing all class load assumptions to be triggered, overwriting all nopable patch points as previously defined to execute a remainder of a conditional test and branch to predetermined algorithm implementations.

7. The computer-implemented method of claim 1, wherein defining compiler-recognized intrinsically-reducible endian-aware helper methods for reading and writing byte and character values in an array, which are recognized by the compiler further comprises wherein on recognition these endian-aware helper methods become hardware instructions to directly write a character width value to an appropriate location in a byte array, and wherein reading and writing the character width value is a single instruction as is reading and writing a byte value directly.

8. An apparatus for multi-byte compressed string representation, the apparatus comprising:
- a communications fabric;
- a memory connected to the communications fabric, wherein the memory contains computer executable program code;
- a communications unit connected to the communications fabric;
- an input/output unit connected to the communications fabric;
- a display connected to the communications fabric; and
- a processor unit connected to the communications fabric, wherein the processor unit executes the computer executable program code to direct the apparatus to:
  - define a package protected final static boolean control field, enableStringCompression, in a String class, which identifies whether compression is one of enabled or disabled, wherein enableStringCompression is initialized on managed runtime startup;
  - define a package protected static control field, stringCompressionFlag, which identifies whether a decompressed string has been created when running with compression enabled;
  - in response to pattern matching by a compiler, nop entire tests based on a null setting of the stringCompressionFlag and register a class loading assumption on a nop location;
  - in response to a determination of supplied arguments to a String class constructor not being compressible, create a decompressed String and initialize a stringCompressionFlag static field;
  - define compiler-recognized intrinsically reducible endian-aware helper methods for reading and writing byte and character values in an array;
  - define compiler-recognized intrinsically reducible helper methods associated with widening, truncation, and masking operations;
  - enhance String class constructors which accept collections of character values to determine whether a supplied collection of characters is compressible, and when determined to be uncompressible create a decompressed String and initialize the stringCompressionFlag static field causing all class load assumptions to be triggered, overwriting all nopable patch points;
  - employ a sign bit of a count integer field of a String object, representing a number of code-points the respective String object contains, as a flag bit set to one for decompressed string representations when compression is enabled, wherein masking and testing of this flag bit is noped using the stringCompressionFlag and an associated class load assumption;
  - provide a set of predetermined alternative package protected string constructors and operations; and
  - check a predetermined location to determine whether supplied arguments to a String class constructor are compressible.

9. A computer program product for multi-byte compressed string representation, comprising a computer readable storage medium having computer executable program code stored thereon, the computer executable program code comprising:
- computer executable program code for defining a package protected final static boolean control field, enableStringCompression, in a String class, which identifies whether compression is one of enabled or disabled, wherein enableStringCompression is initialized on managed runtime startup;
- computer executable program code for defining a package protected static control field, stringCompressionFlag, which identifies whether a decompressed string has been created when running with compression enabled;
- computer executable program code in response to pattern matching by a compiler, for noping entire tests based on a null setting of the stringCompressionFlag and register a class loading assumption on a nop location;
- computer executable program code in response to a determination of supplied arguments to a String class constructor not being compressible, for creating a decompressed string and initialize a stringCompressionFlag static field;
- computer executable program code for defining compiler-recognized intrinsically reducible endian-aware helper methods for reading and writing byte and character values in an array;
- computer executable program code for defining compiler-recognized intrinsically reducible helper methods associated with widening, truncation, and masking operations;
- computer executable program code for enhancing String class constructors which accept collections of character values to determine whether a supplied collection of characters is compressible, and when determined to be uncompressible creating a decompressed String and initialize the stringCompressionFlag static field causing all class load assumptions to be triggered, overwriting all nopable patch points;
- computer executable program code for employing a sign bit of a count integer field of a String object, representing a number of code-points the respective String object contains, as a flag bit set to one for decompressed string representations when compression is enabled, wherein masking and testing of this flag bit is noped using the stringCompressionFlag and an associated class load assumption;
- computer executable program code for providing a set of predetermined alternative package protected string constructors and operations; and
- computer executable program code for checking a predetermined location to determine whether supplied arguments to a String class constructor are compressible.

10. The computer program product of claim 9, wherein computer executable program code for defining compiler-recognized intrinsically-reducible helper methods associated with widening, truncation, and masking operations, further comprises computer executable program code responsive to the compiler emitting a hardware architecture specific instruction to carry out a recognized operation, including an unsigned widening or an unsigned widening and loading from memory, when a predefined compiler-recognized intrinsically-reducible helper method is used directly on an array access.

11. The computer program product of claim 9, wherein the alternative package protected string constructors and operations are used directly by implementations tightly coupled to an implementation of the String object to read and write compressed values when known to be safe.

12. The computer program product of claim 9, wherein a public application programming interfaces of the String object is modified to compress, a configurable amount, when compression is enabled.

13. The computer program product of claim 9, wherein an addition of package protected methods which accept compressed data provides a linkage with implementations of other predetermined classes which are tightly coupled to String, including StringBuffer, StringBuilder, Integer, and Double.

14. The computer program product of claim 9, wherein public application programming interfaces implementations have an additional internal implementation specialized for compressed strings for performance and with a fallback to existing algorithms when dealing with decompressed strings, wherein the existing algorithms use predetermined compiler-recognized intrinsically-reducible helper methods to read/write chars seamlessly with compressed and decompressed String representations.

15. The computer program product of claim 9, wherein a String class library implementation is modified internally to remove an offset field representing an offset of a first code point in a backing array typically used to avoid allocation and copying of the backing array when a substring operation is performed with a non-zero start index.

16. The computer program product of claim 9, wherein enableStringCompression is initialized on managed runtime startup by a virtual machine determining a default state by performing an inspection of a user environment.

17. The computer program product of claim 9, wherein defining a package protected final static boolean control field (enableStringCompression), further comprises:
using a spare bit in a global field.

18. The computer program product of claim 9, wherein employing a sign bit of a count integer field of a String object further comprises one of:

using a spare bit in the String object; and using a respective uniquely owned unshared data representation, which is readily accessible.

19. The computer program product of claim 9, wherein the String class is created as a first string implementation class that delegates all operations to an instance of this abstract class and wherein first string implementation class uses a compressed representation and a second string implementation class that delegates all operations to an instance of this abstract class and wherein the second string implementation class uses an uncompressed representation, and wherein the noped tests are in-lined virtual method call guards.

20. The computer program product of claim 9, wherein multiple compressed string representations exist and each representation has a corresponding indicator bit in an object, and wherein the corresponding indicator bit provides an indication of which instance of representation is reflected when tested.

* * * * *